United States Patent [19]

Risch et al.

[11] Patent Number: 4,905,193
[45] Date of Patent: Feb. 27, 1990

[54] LARGE SCALE INTEGRABLE MEMORY CELL WITH A TRENCH CAPACITOR WHEREIN THE TRENCH EDGE IS SURROUNDED BY A FIELD OXIDE REGION

[75] Inventors: Lothar Risch, Ottobrun; Reinhard Tielert, Munich, both of Fed. Rep. of Germany

[73] Assignee: Siemens Aktiengesellschaft, Berlin and Munich, Fed. Rep. of Germany

[21] Appl. No.: 372,236

[22] Filed: Jun. 26, 1989

Related U.S. Application Data

[63] Continuation of Ser. No. 185,454, Apr. 25, 1988, abandoned.

[30] Foreign Application Priority Data

Jul. 10, 1987 [DE] Fed. Rep. of Germany ....... 3722939

[51] Int. Cl.$^4$ ............................................. G11C 11/24
[52] U.S. Cl. .................... 365/149; 365/182; 357/23.6
[58] Field of Search .............. 365/149, 182; 357/23.6, 357/23.5

[56] References Cited

U.S. PATENT DOCUMENTS

| | | | |
|---|---|---|---|
| 4,641,279 | 2/1987 | Kimura et al. ................. | 365/149 X |
| 4,751,557 | 6/1988 | Sunami et al. ................. | 365/149 |
| 4,751,558 | 6/1988 | Kenney .......................... | 357/23.6 X |
| 4,752,819 | 6/1988 | Koyama ......................... | 365/149 |
| 4,761,385 | 8/1988 | Pfiester ......................... | 357/23.6 |
| 4,763,179 | 8/1988 | Tsubouchi et al. ............. | 357/23.6 |
| 4,774,556 | 9/1988 | Fujii et al. .................... | 357/23.6 |
| 4,792,834 | 12/1988 | Uchida ......................... | 365/149 |

FOREIGN PATENT DOCUMENTS

| | | | |
|---|---|---|---|
| 0154871 | 9/1985 | European Pat. Off. ........... | 365/149 |
| 0223616 | 5/1987 | European Pat. Off. ........... | 357/23.6 |
| 0234891 | 9/1987 | European Pat. Off. ........... | 365/149 |
| 61-56449 | 3/1986 | Japan ............................. | 357/23.6 |
| 62-193168 | 8/1987 | Japan ............................. | 357/23.6 |

OTHER PUBLICATIONS

IBM Tech. Discl. Bull., vol. 30, No. 12, May 88, pp. 109–110, "Self-Aligned Polycide Bitline Structure" (by no author).

"An Experimental 4-Mbit CMOS Dram", IEEE Journal of Solid-State Circuits, vol. SC-21, No. 5, Oct. 1986, pp. 605–611.

*Primary Examiner*—Stuart N. Hecker
*Assistant Examiner*—Alfonso Garcia
*Attorney, Agent, or Firm*—Hill, Van Santen, Steadman & Simpson

[57] ABSTRACT

A large scale integrable memory cell including a field effect transistor lying at a bit line and further including a storage capacitor which is formed by the wall of a trench and a cooperating electrode. The active region of the storage cell which lies outside the trench is fashioned in the form of a strip. The end face forms one part of the trench edge and the remaining portion of the trench edge is surrounded by a field oxide region.

7 Claims, 2 Drawing Sheets

LARGE SCALE INTEGRABLE MEMORY CELL WITH A TRENCH CAPACITOR WHEREIN THE TRENCH EDGE IS SURROUNDED BY A FIELD OXIDE REGION

This is a continuation of application Ser. No. 185,454, filed Apr. 25, 1988, now abandoned.

BACKGROUND OF THE INVENTION

1. Field of the Invention

The present invention is directed to a large scale integrable memory cell including the combination of a field effect transistor and a capacitor associated with a trench formed in a semiconductor substrate.

2. Description of the Prior Art

A memory cell of the type with which the present invention is concerned is generally shown in the IEEE Journal of Solid State Circuits, Volume SC-21, No. 5, October 1986, pages 605–611, particularly FIG. 1. The planar, active region of the memory cell adjacent to the trench in the lateral direction encompasses the entire trench edge so that the lateral limitation of the trench lies inside the lateral limitation of the active region while providing an adjustment spacing. With the adjustment spacing, after the placement of the active region of the memory cell on the semiconductor body, the position of a mask which defines the lateral limits of the trench can differ from its intended position by an amount which is smaller than the adjustment spacing without the storage capacitance being increased by the trench wall deviating too far from its rated value. The adjustment spacing between the trench edge and the lateral limitation of the active region, however, causes an increase in the area requirement for the memory cell.

SUMMARY OF THE INVENTION

The present invention provides a memory cell of the type described which provides a reduction in the area requirement in comparison to conventional memory cells, but still provides a comparable value of capacitance in the storage capacitor. Specifically, the large scale integrable memory cell of the present invention includes a semiconductor substrate of a first conductivity type, with a field effect transistor formed in the substrate. A bit line is connected to the field effect transistor. A storage capacitor is formed in the substrate as is a trench, one wall of the trench forming one electrode of the storage capacitor. An insulating layer is deposited over the substrate and has a strip shaped thin film region forming part of a memory cell and laterally adjoining an edge of the trench. The thin film region defines that portion of the active region of the memory cell which lies outside the trench. The insulating layer also includes a thick film region surrounding the thin film region. A layer of electrically conductive material covers the insulating layer and constitutes the second electrode of the storage capacitor. A face end of a portion of the active region forms a part of the edge of the trench. The remainder of the edge of the trench is directly surrounded by the thick film region of the insulating layer.

In a preferred embodiment of the invention, the face end of the portion of the active region defined by the thin film region is smaller than the side of the edge of the trench which faces the active region. The perimeter of the trench is preferably surrounded by a semiconductor region of the second conductivity type with respect to the substrate.

A field effect transistor generally comprises two semiconductor regions of the second conductivity type, with a channel region of opposite conductivity type separating the two semiconductor regions. One of the semiconductor regions is connected to the first electrode of the storage capacitor and the other is in communication with the bit line. A gate composed of part of the bit line is separated from a part of the thin film region by a boundary surface of the semiconductor substrate. In another preferred form of the invention, the field effect transistor of two identical memory cells comprises a shared semiconductor region of the second conductivity type in communication with a bit line.

Where a plurality of groups of memory cell pairs is provided, the field effect transistors of all memory cells within each of the groups is connected to a bit line, individual groups of memory cell pairs together with their associated bit lines being arranged on the semiconductor substrate in side-by-side and line-by-line fashion.

The improved method of the present invention involves applying a mask to the surface of a semiconductor body of a first conductivity type, the mask covering the portions which correspond in position to the active region of the memory cell, the active region overlapping an area of the substrate in which a trench is to be provided. Portions of the substrate not covered by the mask are then locally oxidized through the use of the mask. After removal of the mask, a second mask is applied and etching of the trench occurs in the substrate. The second mask is then removed and a semiconductor region of a second conductivity type is generated in surrounding relation to the trench. A thin film is grown on the active region of the memory cell and a thin insulating layer on a wall of the trench. A first conductive coating is then deposited after which the coating is covered with a first insulating layer. Portions of the conductivity coating and the first insulating layer that cover the region of the field effect transistor are then removed. A second conductive coating is then deposited in the form of a word line. Source and drain regions are formed in the field effect transistor whereupon a second insulating layer is applied. Then, a via hole is formed in the second insulating layer and in the thin film region. A third conductive coating is applied and a bit line is formed from the third conductive coating, the bit line contacting a source and drain region in the region of the via hole.

The particular advantage of the present invention is that the part of the active region of the memory cell which lies outside of the trench is significantly diminished in comparison to known memory cells since it no longer completely surrounds the trench. Maladjustments of the trench relative to the active region of the memory cell that correspond to a prescribed adjustment spacing, moreover, do not lead to a deviation in the size of the storage capacitor in the manufacture of the memory cell of the invention as is the case in known memory cells of this type.

BRIEF DESCRIPTION OF THE DRAWINGS

The invention will be set forth in greater detail with reference to the drawings, in which.

DESCRIPTION OF THE PREFERRED EMBODIMENTS

Figure 1:
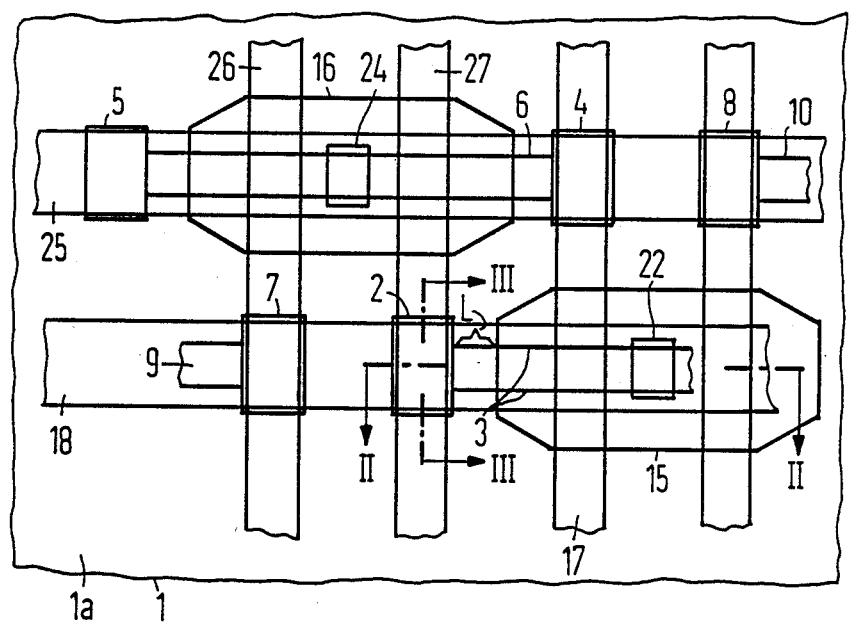
FIG. 1 is a plan view of a memory cell produced according to the present invention illustrating adjoining parts of a memory area composed of a plurality of such memory cells.
Figure 2:
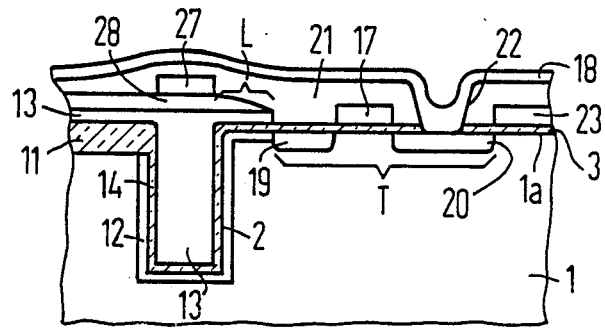
FIG. 2 is a cross-sectional view of the cells shown in FIG. 1 along the line II—II.

FIGS. 1 and 2 show a part of the memory area of a dynamic semiconductor memory composed of a plurality of memory cells according to the present invention, the semiconductor memory being formed on a substrate body 1 of doped semiconductor material such as Si. The plan view of FIG. 1 shows a rectangular structure 2 to which a horizontally extending strip 3 adjoins at the right-hand side. Reference numeral 2 thereby represents the lateral limitation of a trench that, proceeding from the boundary surface 1a of the semiconductor body 1, extends into the semiconductor body 1.

The wall of the trench 2 essentially forms the memory region of a memory cell fashioned in accordance with the invention, whereas the strip 3 defines the active region of the memory cell lying outside of the trench 2. A field effect transistor providing for the selection of the memory cell lies in this active region. Identically constructed memory cells are indicated by the trenches 4 and 5 in FIG. 1, their active regions being indicated by a horizontal stripe 6 connecting these trenches to one another. The trenches of two further memory cells are identified at reference numerals 7 and 8, with their active regions being shown at reference numerals 9 and 10.

The semiconductor substrate 1 may be composed of p-conductive silicon and has a boundary surface 1a covered across its surface with an insulating layer that includes individual thin film regions individually associated with the memory cells. These are identical to the stripe shaped regions 3, 6, 9 and 10. Outside of these regions, the insulating layer includes a self-contained thick film region except for the recesses that arise due to the trenches 2, 4, 5, 7 and 8. With the formation of the insulating layer of $SiO_2$, the thin film regions 3, 6, 9 and 10 are also referred to as gate oxide layers. The parts of the $SiO_2$ layer lying outside of these thin film regions are referred to as the field oxide layers. The gate oxide layer 3 may be seen at the right adjacent to the trench 2 in FIG. 2 and the field oxide layer 11 may be seen at the left adjacent to the trench 2. The designations gate oxide layer and field oxide layer are used in the discussion following below.

As shown in FIG. 2, the wall of the trench 2 may be provided with what is referred to as a trench doping that generates a semiconductor region 12 surrounding the trench 2 and having a conductivity type opposite to that of the semiconductor substrate 1. In the example given, this involves an n-type conductive region 12. In general terms, the wall of the trench 2 or of the semiconductor region 12 represents the first electrode of a storage capacitor. The second electrode is formed by a first electrically conductive layer 13 that covers both a wall of the trench 2 as well as an adjoining part of the gate oxide 2 over a length L and also covers large parts of the field oxide layer 11. The layer 13 may be composed of a first, highly doped layer of polycrystalline silicon. It is separated from the wall of the trench 2 by a thin insulating layer 14, the layer 14 being generated together with the gate oxide layers 3, 6, 9 and 10 in the same oxidation step. The lateral extent of the layer 13 may be seen best with reference to FIG. 1 where it is noted that reference numerals 15 and 16 indicate two octagonal recesses in the layer and all parts of the field oxide layer 11 and of the gate oxide layers 3, 6, 9 and 10 lying outside of recesses 15 and 16 are covered by the layer 13.

A field effect transistor T arranged for the selection of the memory cell 2, 3 lies inside the recess 15, the field effect transistor T being associated with a word line 17 and effecting the optional connection of this memory cell to a bit line 18. The transistor T is composed of a drain or source region 19 and of a source or drain region 20 that are both n+ doped. The region 19 is in communication with the semiconductor region 12. The channel region of the transistor T lying between regions 19 and 20 at the surface of the semiconductor substrate 1 is covered with a gate that is composed of a part of the word line 17 and is separated from the boundary surface 1a by the gate oxide layer 3. The word line 17 that is typically formed of a second layer of polycrystalline silicon is covered by an intermediate insulating layer 21. The bit line 18 which is composed, for example, of aluminum contacts the region 20 in the region of a via hole 22 of the intermediate insulating layer 17 and of the gate oxide layer 3.

Figure 3:
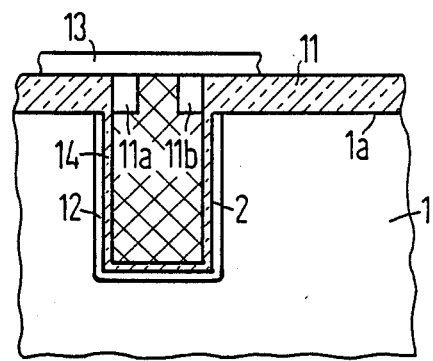
FIG. 3 is a cross-sectional view through the memory cell of FIG. 1 taken along the line III—III.
Figure 4:
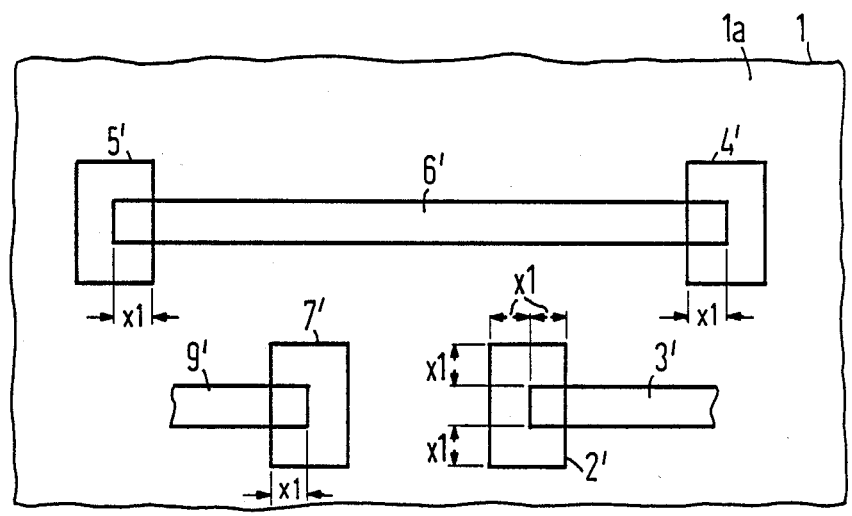
FIG. 4 illustrates a mask for the manufacture of a memory cell according to FIG. 1.

For further illustration of the invention, FIG. 3 shows a cross section through the storage capacitor 12, 13 along the line III—III of FIG. 1 in a schematic illustration. It can be seen that the trench 2 has its edge lying in the boundary surface 1a surrounded by the field oxide layer 11 and that it is surrounded by the n+ doped region 12 below layer 11. The conductive layer 13 has been shown only above the field oxide layer 11 for reasons of a clear illustration, but it also fills out the interior of the trench 2 lined with the thin insulating layer 14. The parts 11a and 11b of the field oxide layer 11 may be seen at the wall of the trench 2 facing toward the active region 3 that is visible in FIG. 3, the parts 11a and 11b of the field oxide layer 11 limiting that part of the wall contributing to the storage capacitance to the area indicated with the cross-hatching. The width of the cross-hatched area measured above the boundary surface 1a corresponds to the width of the gate oxide layer 3.

In operation, the electrode 13 of the storage capacitor is charged with a fixed voltage. With a selection of the memory cell 2, 3, the word line 17 is provided with a voltage which causes the transistor T to proceed into its transmissive condition. With the appearance of a first logic signal on the bit line 18, charge carriers are thus transported by means of the conductive transistor T into the semiconductor region 12 but are not transported therein until the appearance of a second logic signal on the bit line. The appropriate logic signal is then stored in the memory cell 2, 3 due to the charge status of the storage capacitor 12, 13 that is then achieved. In order to read this cell out, the transistor T is again switched to its transmissive state and the charge status of the storage capacitor 12, 13 is interrogated by means of the bit line previously brought to a defined potential. This potential is selected such that the charge carriers potentially stored in the storage capacitor 12, 13 effect a change in potential on the bit line in one direction, whereas, on the other hand, the potential is modified in the opposite direction when the bit line is connected to a storage capacitor that is not charged.

The described structure of the memory cell 2, 3 in which the active region of the memory cell lying under the gate oxide layer 3 has its end face forming a part of the edge of the trench 2 whereas the remaining part of the trench edge is immediately surrounded by the field oxide region 11 reduces the area required of the memory cell to a rather considerable degree since no part of the gate oxide layer 3 is situated outside of the left-hand, upper and lower limitation of the trench 2 shown in FIG. 1. The trench 7 of the next memory cell is arranged under the same bit line 18 and can therefore also be placed significantly closer to the trench 2 than would be possible with the traditional memory cells of this type wherein the gate oxide layer 3 completely surrounds the trench 2.

As may be seen from FIG. 2, two neighboring cells lying under the same bit line, for example, line 18, are combined to form a pair of memory cells and their field effect transistors comprise a shared source or drain region 20. In FIG. 2, the gate of the field effect transistor that belongs to the memory cell lying to the right of the region 20 is identified at 23. FIG. 1 shows that the field effect transistors of the further memory cells, for example, 4, 6 and 5, 6 also comprise a shared source or drain region that is contacted in the region of a via hole 24 by a bit line 25 shared by these memory cells. The word lines 26 and 27 that serve for the selection of the memory cells 5, 6 and 4, 6 extend outside of the recess 16 of the conductive coating 13 above an intermediate insulating layer 28 that separates them from the coating 13. In the same way, the word line 17 is separated from the coating 13 outside of the recess by the intermediate insulating layer.

In the manufacture of the memory cells of the invention, the boundary surface 1a is covered with a first mask composed, for example, of $Si_3N_4$ only in the region of the area portions referenced 3', 6' and 9'. All regions lying outside of these area portions are locally oxidized thereby forming the field oxide layer 11. The masked area portion 3' corresponds in position to the gate oxide region 3 (FIG. 1) with the difference, however, that it overlaps the area portion 2' provided for the trench 2 by an amount x1. Likewise, the masked area portions 6' and 9' that correspond in position to the later formed gate oxide regions 6 and 9 also have their ends respectively extended by the amount x1. The removal of the first mask is followed by a masked etching step wherein a second mask covers the boundary surface 1a except for the surface portions 2', 4', 5' and 7' and the trenches 2, 4, 5 and 7 are etched into the semiconductor substrate 1. The second mask can be maladjusted by the amount x1 relative to its desired position in horizontal and/or vertical direction without the values of capacitance of the individual storage capacitors deviating significantly from their rated values.

After the formation of the trenches 2, 4, 5 and 7 and removal of the second mask, the trench dopings are undertaken whereby the semiconductor regions such as region 12 surrounding the trenches are formed. This is followed by the growth of the gate oxide layers such as layer 3 in a known way on the area portions 3', 6' and 9' and of the thin insulating layers, for example, 14, on the walls of the trenches 2, 4, 5 and 7. A conductive coating 13 is subsequently deposited across the surface, the layer preferably comprising a first highly doped layer of polycrystalline silicon. This is covered across the surface by an intermediate insulating layer 28, whereby the portions 15 and 16 of the conductive coating 13 and the parts of the intermediate insulating layer 28 lying thereabove are in turn subsequently removed with photolithographic steps. This is followed by the application of a second conductive coating, particularly a second, highly doped polycrystalline silicon layer by means of which the word lines 17, 23, 26 and 27 are formed with photolithographic steps. The regions 19 and 20 are subsequently formed with an ion implantation. This is followed by the application of an intermediate insulating layer 21 and by producing the via holes such as hole 22 in the layers 21 and 3. Finally, a further conductive coating consisting, for example, of aluminum is applied to the intermediate insulating layer 21. The bit lines, for example lines 18 and 25, are formed from this further conductive coating by means of photolithographic steps.

In a memory cell of the type shown in FIG. 1, the dimensions of the trench parallel to the bit line 18 can, for example, amount to 0.8 μm and may be 1.4 μm parallel to the word line 17. With a trench depth of about 6 μm, a word line width of about 0.8 μm, a spacing between the word line 17 and the trench 2 of about 1 μm, and a width of the active region 3 of about 0.6 μm, an area requirement of about 7.2 $\mu m^2$ is obtained for the entire memory cell 2, 3 with a storage capacitance of about 30 to 50 fF. The area dimensions parallel to the direction of the word lines amount to about 2 μm and those parallel to the direction of the bit line amount to about 3.6 μm. A spacing of 1 μm between two adjacent trenches, for example, trenches 2 and 7, lying under the same bit line is thereby assumed. Since a semiconductor area of about 10 to 12 $\mu m^2$ per memory cell is required for a dynamic semiconductor memory having a storage capacity of 4 Mbit, such a memory can be constructed with reduced area in the cells of the present invention. When a dynamic semiconductor memory having a storage capacity of 16 Mbit is based on an approximate area requirement of 4 to 6 $\mu m^2$ per memory cell, the cell design of the present invention can also be employed with somewhat stricter design rules.

It will be understood that various modifications can be made to the described embodiments without departing from the scope of the present invention.

We claim as our invention:

1. A large scale integrable memory cell, comprising:
    a semiconductor substrate of a first conductivity type;
    a field effect transistor formed in said substrate;
    a bit line operatively connected to said field effect transistor;
    a storage trench capacitor formed in said substrate, said trench capacitor including edges positioned at an upper boundary of said substrate, one wall of said trench capacitor forming one electrode of said storage capacitor, said electrode being operatively connected to said transistor;
    an insulating layer over said substrate, said insulating layer having a strip-shaped thin film region extending from a lateral edge of said trench capacitor over said transistor, said thin film region defining an active region of the memory cell which lies outside of said trench capacitor, said insulating layer also including a thick film region surrounding said thin film region and directly surrounding the edges of said trench capacitor not contacted by said thin film region,
    said thick film region having a thickness, as measured substantially perpendicularly from said substrate boundary surface, which is greater than a thickness of said thin film region; and a layer of electrically conductive material covering said insulating layer and constituting a second electrode of said storage capacitor.

2. A memory cell according to claim 1 wherein a width of the active region defined by said thin film region at the edge where the thin film region contacts the trench capacitor, is less than a length of the edge of said trench capacitor which contacts said active region.

3. A memory cell according to claim 1 wherein a perimeter of said trench is surrounded by a semiconductor region of a second conductivity type.

4. A memory cell according to claim 1 wherein said field effect transistor comprises:
two semiconductor regions of a second conductivity type;
a channel region of opposite conductivity type separating said two semiconductor regions, one of said semiconductor regions being connected to said first electrode of said storage capacitor and the other being coupled to a bit line; and
a gate composed of part of said bit line and being separated by a part of said thin film region from the boundary surface of said semiconductor substrate.

5. A memory cell assembly comprising two identical memory cells as defined in claim 4, the field effect transistors of both cells comprising a shared semiconductor region of said second conductivity type in communication with a bit line.

6. A memory cell assembly according to claim 5 comprising a plurality of groups of memory cell pairs, the field effect transistors of all memory cells within each of the groups being connected to a bit line, the individual groups of memory cell pairs together with their associated bit lines being arranged on said semiconductor substrate in side-by-side and line-by-line fashion.

7. A memory cell, comprising:
a substrate having a top boundary surface;
a field effect transistor formed in the substrate;
a trench capacitor formed in the substrate near the transistor, the trench of the capacitor being covered by a liner wall of an electrically conductive material forming a first electrode of the capacitor, the liner wall extending out from the trench and being operatively coupled to the transistor, the trench further including upper edges forming an upper perimeter at the boundary surface of the substrate, an edge over which the liner wall extends being relatively higher than the remaining edges;
an insulating layer covering the substrate boundary surface, a thin film region of the insulating layer being relatively thinner than the remaining insulating layer, the thin film region being strip shaped and extending from the relatively higher edge of the trench over the transistor, the thin film region defining an active region of the memory cell which lies outside of the capacitor; and
a layer of electrically conductive material covering the insulating layer and extending into the trench to form a second electrode of the capacitor.

* * * * *